(12) United States Patent
Chung et al.

(10) Patent No.: US 11,322,071 B2
(45) Date of Patent: May 3, 2022

(54) OPERATIONAL AMPLIFIER COMPENSATING FOR OFFSET VOLTAGE, GAMMA CIRCUIT AND SOURCE DRIVER INCLUDING SAME

(71) Applicant: SAMSUNG ELECTRONICS CO., LTD., Suwon-si (KR)

(72) Inventors: Kyunghoon Chung, Hwaseong-si (KR); Jaesung Kang, Hwaseong-si (KR); Jihyun Lee, Gwangmyeong-si (KR); Jeongwoo Lim, Hwaseong-si (KR); Yunseok Jang, Anyang-si (KR); Jaewon Choi, Paju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/090,720

(22) Filed: Nov. 5, 2020

(65) Prior Publication Data
US 2021/0366344 A1 Nov. 25, 2021

(30) Foreign Application Priority Data
May 22, 2020 (KR) .................. 10-2020-0061770

(51) Int. Cl.
*G09G 3/20* (2006.01)
*H03F 3/45* (2006.01)
(52) U.S. Cl.
CPC ....... *G09G 3/2007* (2013.01); *H03F 3/45183* (2013.01); *G09G 3/2003* (2013.01);
(Continued)
(58) Field of Classification Search
CPC .................................................. G09G 3/2007
(Continued)

(56) References Cited

U.S. PATENT DOCUMENTS
6,448,836 B2 9/2002 Kokubun et al.
7,042,289 B2 5/2006 Hwang et al.
(Continued)

FOREIGN PATENT DOCUMENTS
JP 2008042502 A 2/2008
KR 792378 A 1/2008

OTHER PUBLICATIONS

Ankur Beohar et al., "A Class AB Amplifier With a Reduced Crossover Distortion for Signal Driver", IACSIT International Journal of Engineering and Technology, vol. 2, No. 5, Oct. 2010, 486-490.
(Continued)

*Primary Examiner* — Long D Pham
(74) *Attorney, Agent, or Firm* — Volentine, Whitt & Francos, PLLC

(57) ABSTRACT

An operational amplifier includes an input stage with a first main input unit, a first auxiliary input unit, a second main input unit and a second auxiliary input unit, an amplification stage with a first current mirror receiving currents from the first main input unit and the first auxiliary input unit, and a second current mirror receiving currents from the second main input unit and the second auxiliary input unit, an output stage receiving voltages from the first current mirror and the second current mirror, a voltage storage unit storing an intermediate voltage based on an output signal generated by the output stage during at least one of a first operation period and a second operation period, and a switching unit that differently controls a first feedback path between the output stage and the input stage and a second feedback path between the output stage to the voltage storage unit in accordance with the first operation period and the second operation period.

20 Claims, 15 Drawing Sheets

(52) U.S. Cl.
CPC . *G09G 2300/0452* (2013.01); *G09G 2300/08* (2013.01); *G09G 2310/027* (2013.01); *G09G 2310/0291* (2013.01); *H03F 2200/375* (2013.01)

(58) Field of Classification Search
USPC .......................................................... 345/690
See application file for complete search history.

(56) References Cited

U.S. PATENT DOCUMENTS

| | | | |
|---|---|---|---|
| 7,659,777 | B2 | 2/2010 | Fujino et al. |
| 10,355,655 | B2 | 7/2019 | Nallani et al. |
| 10,418,954 | B1 | 9/2019 | Price et al. |
| 2003/0103029 | A1* | 6/2003 | Kokubun ............ H03F 3/45753 345/99 |
| 2010/0225678 | A1* | 9/2010 | Kim ...................... G09G 3/3696 345/690 |
| 2011/0199366 | A1* | 8/2011 | Tsuchi ................. G09G 3/3688 345/212 |
| 2015/0325200 | A1* | 11/2015 | Rho ..................... G09G 3/3688 345/212 |
| 2019/0123701 | A1 | 4/2019 | Wani |

OTHER PUBLICATIONS

Chih-Wen Lu, "A Rail-To-Rail Class-AB Amplifier With an Offset Cancellation for LCD Drivers", IEEE Journal of Solid-State Circuits, vol. 44, No. 2, Feb. 2009, 525-537.

Chong-Gun Yu et al., "An Automatic Offset Compensation Scheme With Ping-Pong Control for SMOS Operational Amplifiers", IEEE Journal of Solid-State Circuits, vol. 29, No. 5, May 1994, 601-610.

* cited by examiner

OPERATIONAL AMPLIFIER COMPENSATING FOR OFFSET VOLTAGE, GAMMA CIRCUIT AND SOURCE DRIVER INCLUDING SAME

CROSS-REFERENCE TO RELATED APPLICATION

This U.S. non-provisional application claims priority under 35 USC § 119 to Korean Patent Application No. 10-2020-0061770 filed on May 22, 2020 in the Korean Intellectual Property Office (KIPO), the subject matter of which is hereby incorporated by reference.

BACKGROUND

1. Technical Field

Embodiments of the inventive concept relate generally to semiconductor integrated circuits. More particularly, embodiments of the inventive concept relate to operational amplifiers compensating for an offset voltage, as well as a gamma circuit and a source driver including such operational amplifiers.

2. Discussion of the Related Art

An operational amplifier outputs a non-zero voltage even when the same voltage is applied to its input terminals. In this regard, an "offset voltage" is a voltage that may be applied to one of the input terminals of an operation amplifier such that the output of the operation amplifier becomes 0V. An offset voltage may arise due to errors in the design and/or difficulties in the fabrication of a semiconductor integrated circuit. Offset voltage(s) are particularly problematic in certain electronic devices such as high-end televisions and emerging mobile phones.

SUMMARY

Embodiments of the inventive concept provide operational amplifier(s), as well as gamma circuits and source drivers including operational amplifier(s), capable of efficiently reducing offset voltages, reducing overall power consumption and/or occupying reduced area.

According to embodiments, an operational amplifier compensating for an offset voltage and alternately operating in a first operation period and a second operation period includes; an input stage including a first main input unit, a first auxiliary input unit, a second main input unit and a second auxiliary input unit, an amplification stage including a first current mirror and a second current mirror, the first current mirror receiving currents generated from the first main input unit and the first auxiliary input unit, and the second current mirror receiving currents generated from the second main input unit and the second auxiliary input unit, an output stage configured to receive voltages generated by the first current mirror and the second current mirror, a voltage storage unit configured to store an intermediate voltage based on an output signal generated by the output stage during at least one of the first operation period and the second operation period, and a switching unit configured to differently control a first feedback path between the output stage and the input stage and a second feedback path between the output stage to the voltage storage unit in accordance with the first operation period and the second operation period.

According to embodiments, a gamma circuit generating a gamma voltage and includes; a plurality of gamma amplifiers, a bias circuit configured to generate a bias signal and provide the bias signal to the plurality of gamma amplifiers. and a voltage divider configured to generate a plurality of grayscale voltages based on gamma reference voltages buffered and output through the plurality of gamma amplifiers. Each of the plurality of gamma amplifiers may include; a first operational amplifier outputting a first signal, a second operational amplifier outputting a second signal and a circuit selector configured to select and output one of the first signal and the second signal. Each of the first operational amplifier and the second operational amplifier may include; an input stage including a first main input unit, a first auxiliary input unit, a second main input unit and a second auxiliary input unit, an amplification stage including a first current mirror and a second current mirror, the first current mirror receiving currents generated from the first main input unit and the first auxiliary input unit, and the second current mirror receiving currents generated from the second main input unit and the second auxiliary input unit, an output stage configured to receive voltages generated by the first current mirror and the second current mirror, a voltage storage unit configured to store an intermediate voltage based on an output signal generated by the output stage during at least one of the first operation period and the second operation period and a switching unit configured to differently control a first feedback path between the output stage and the input stage and a second feedback path between the output stage to the voltage storage unit in accordance with the first operation period and the second operation period.

According to embodiments, a source driver includes; a digital circuit configured to receive and process a digital pixel data and an analog circuit configured to convert the digital pixel data into a grayscale voltage in a form of an analog signal and output the grayscale voltage. The analog circuit may include a gamma circuit that generates a plurality of voltages and includes; an input stage including a first main input unit, a first auxiliary input unit, a second main input unit and a second auxiliary input unit, an amplification stage including a first current mirror and a second current mirror, the first current mirror receiving currents generated from the first main input unit and the first auxiliary input unit, and the second current mirror receiving currents generated from the second main input unit and the second auxiliary input unit, an output stage configured to receive voltages generated by the first current mirror and the second current mirror, a voltage storage unit configured to store an intermediate voltage based on an output signal generated by the output stage during at least one of the first operation period and the second operation period and a switching unit configured to differently control a first feedback path between the output stage and the input stage and a second feedback path between the output stage to the voltage storage unit in accordance with the first operation period and the second operation period.

BRIEF DESCRIPTION OF THE DRAWINGS

Certain embodiments of the inventive concept may be more clearly understood upon consideration of the following detailed description together with the accompanying drawings.

DETAILED DESCRIPTION

Embodiments of the inventive concept will now be described in some additional detail with reference to the accompanying drawings. Throughout the written description and drawings, like reference numbers and labels are used to denote like or similar elements and features.

Figure 1:
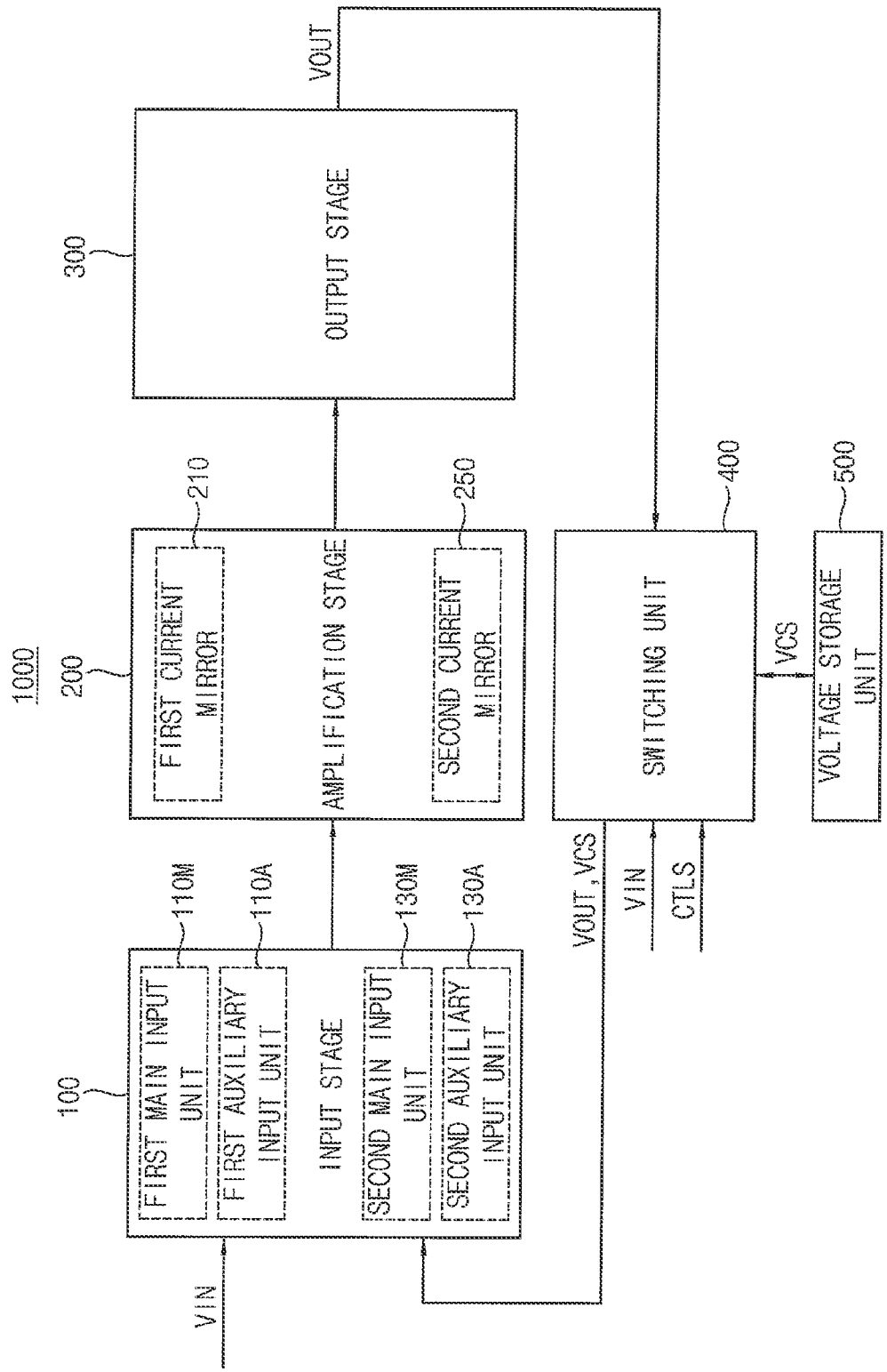
FIG. 1 is a block diagram illustrating an operational amplifier according to embodiments of the inventive concept.

Figure (FIG. 1 is a block diagram illustrating an operational amplifier 1000 that is capable of compensating for an offset voltage according to embodiments of the inventive concept.

Referring to FIG. 1, the operational amplifier 1000 alternately operates in a first operation period and a second operation period. Here, the first operation period may be referred to as a sampling period, and the second operation period may be referred to as a driving period.

The operational amplifier 1000 of FIG. 1 includes an input stage 100, an amplification stage 200, an output stage 300, a switching unit 400 and a voltage storage unit 500. The input stage 100 receives an input signal VIN, as well as either an output signal VOUT or a storage signal VCS. In some embodiments, the input signal VIN may be externally provided, whereas the selective provided output signal VOUT or storage signal VCS are internally generated signals provided by (or through) the switching unit 400. In this regard, the output signal VOUT may be a signal provided by the output stage 300, and the storage signal VCS may be a signal provided by (or stored in) the voltage storage unit 500.

During the first operation period, the input stage 100 may receive the input signal VIN and an output signal VOUT. However, during the second operation period, the input stage 100 may receive the input signal VIN, the output signal VOUT and/or the storage signal VCS. As a result, the magnitude of the output signal VOUT during the first operation period may be different from the magnitude of the output signal VOUT during the second operation period.

The storage signal VCS may be a signal obtained by storing the output signal VOUT during the first operation period. A first output level for the output signal VOUT during the first time period may be reflect (or arise as the result of) an offset voltage applied to the input signal VIN received by the operational amplifier 1000. A second output level for the output signal VOUT during the second operation period may have the same level as the input signal VIN received by the operational amplifier 1000.

In some embodiments, the input stage 100 may include a first main input unit 110M, a first auxiliary input unit 110A, a second main input unit 130M and a second auxiliary input unit 130A. During each of the first operation period and the second operation period, signals input to each of the first main input unit 110M, the first auxiliary input unit 110A, the second main input unit 130M and the second auxiliary input unit 130A may be different. However, the first main input unit 110M may generate one or more currents (hereafter, "currents") based on signals input to the first main input unit 110M and may supply the currents to the amplification stage 200. The first auxiliary input unit 110A may generate currents based on signals input to the first auxiliary input unit 110A and may supply the currents to the amplification stage 200. The second main input unit 130M may generate currents based on signals input to the second main input unit 130M and may supply the currents to the amplification stage 200. The second auxiliary input unit 130A may generate currents based on signals input to the second auxiliary input unit 130A and may supply the currents to the amplification stage 200. These functions will be described hereafter in some additional detail.

The amplification stage 200 receives the currents generated by the input stage 100, and in response to the currents, generates voltages and supplies the voltages to the output stage 300. In some embodiments, the amplification stage 200 includes a first current mirror 210 and a second current mirror 250. Here, the first current mirror 210 may receive currents generated by the first main input unit 110M and the first auxiliary input unit 110A. The second current mirror 250 may receive currents generated by the second main input unit 130M and the second auxiliary input unit 130A.

Figure 2:
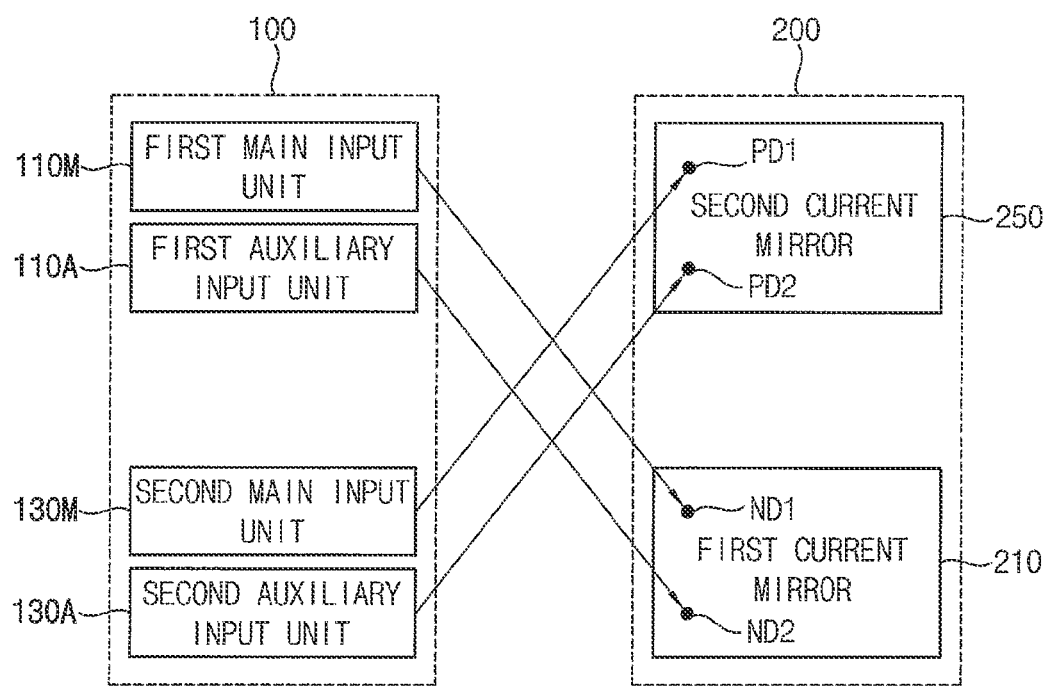
FIG. 2 is a block diagram illustrating one possible connection relationship between the input stage 100 and the amplification stage 200 of the operational amplifier 1000 of FIG. 1.

FIG. 2 is a conceptual diagram illustrating possible connection relationship(s) between the input stage 100 and the amplification stage 200 in the operational amplifier 1000 of FIG. 1.

Referring to FIGS. 1 and 2, the first current mirror 210 may include a first node ND1 and a second node ND2, and the second current mirror 250 may include a third node PD1 and a fourth node PD4. In some embodiments, respective output nodes of the first main input unit 110M and the first auxiliary input unit 110A may be connected to the first node ND1 and the second node ND2 of the first current mirror 210. And respective output nodes of the second main input unit 130M and the second auxiliary input unit 130A may be connected to the third node PD1 and the fourth node PD2 of the second current mirror 250.

With the foregoing configuration, the operational amplifier 1000 may be implemented as a complementary metal-oxide semiconductor (CMOS) circuit. That is, the first main input unit 110M and the first auxiliary input unit 110A may be respectively implemented as a P-type MOS circuit (PMOS), and the second main input unit 130M and the second auxiliary input unit 130A may be respectively implemented as an N-type MOS circuit (NMOS). The first current mirror 210 may be implemented as an NMOS circuit, and the second current mirror 250 may be implemented as a PMOS circuit. Accordingly, the first main input unit 110M and the first auxiliary input unit 110A may include first PMOS transistors, and the second main input unit 130M and the second auxiliary input unit 130A may include first NMOS transistors, such that the first PMOS transistors and the first NMOS transistors form a first CMOS circuit. The first current mirror 210 may include second NMOS transistors and the second current mirror 250 may include second PMOS transistors, such that the second NMOS transistors and the second PMOS transistors form a second CMOS circuit.

When the operational amplifier 1000 is implemented as a CMOS circuit, the first main input unit 110M and the first auxiliary input unit 110A may be implemented as a PMOS circuit in the input stage 100 connected to the first current mirror 210 implemented as an NMOS circuit in the amplification stage 200. The second main input unit 130M and the second auxiliary input unit 130A implemented as an NMOS circuit in the input stage 100 may be connected to the second current mirror 250 implemented as a PMOS circuit in the amplification stage 200. In this case, the first current mirror 210 and the second current mirror 250 may be connected in series between a power supply voltage and ground, thereby occupying relatively little area in the constituent semiconductor device.

Referring back to FIG. 1, the output stage 300 may receive currents generated by the amplification stage 200, generates voltages (including at least the output voltage VOUT) based on the currents, and provide the voltages to the switching unit 400 and voltage storage unit 500, as well as possibly providing the voltages to one or more external circuits.

Thus, the switching unit 400 may receive the output signal VOUT from the output stage 300, the storage signal VCS from the voltage storage unit 500, and the externally generated input signal VIN. In some embodiments, the switching unit 400 may a number of switches (e.g., transistors) controlled at least in part by a switch control signal CTLS also received by the switching unit 400. With this configuration, the switching unit 400 may variously control one or more feedback path(s) between the output stage 300 and the input stage 100 during the first operation period and during the second operation period. In this regard, the one or more feedback path(s) may include a first feedback path between the output stage 300 and the input stage 100, and a second feedback path between the output stage 300 and the voltage storage unit 500.

The voltage storage unit 500 may be configured to sample the output signal VOUT during the first operation period and during the second operational period, and store the resulting samples as an "intermediate voltage." For example, during the first operation period, the switching unit 400 the second feedback path may be enabled, such that the intermediate voltage may be generated by sampling performed by the voltage storage unit 500. However, during the second operation period, the second feedback path may be disabled.

In some embodiments, the switching unit 400 may disable the first feedback path during the first operation period, such that the output signal VOUT is not applied to the first main input unit 110M and the second main input unit 130M of the input stage. The switching unit 400 may enable the first feedback path during the second operation period, such that the output signal VOUT is applied to the first main input unit 110M and the second main input unit 130M input stage 100.

Figure 3:
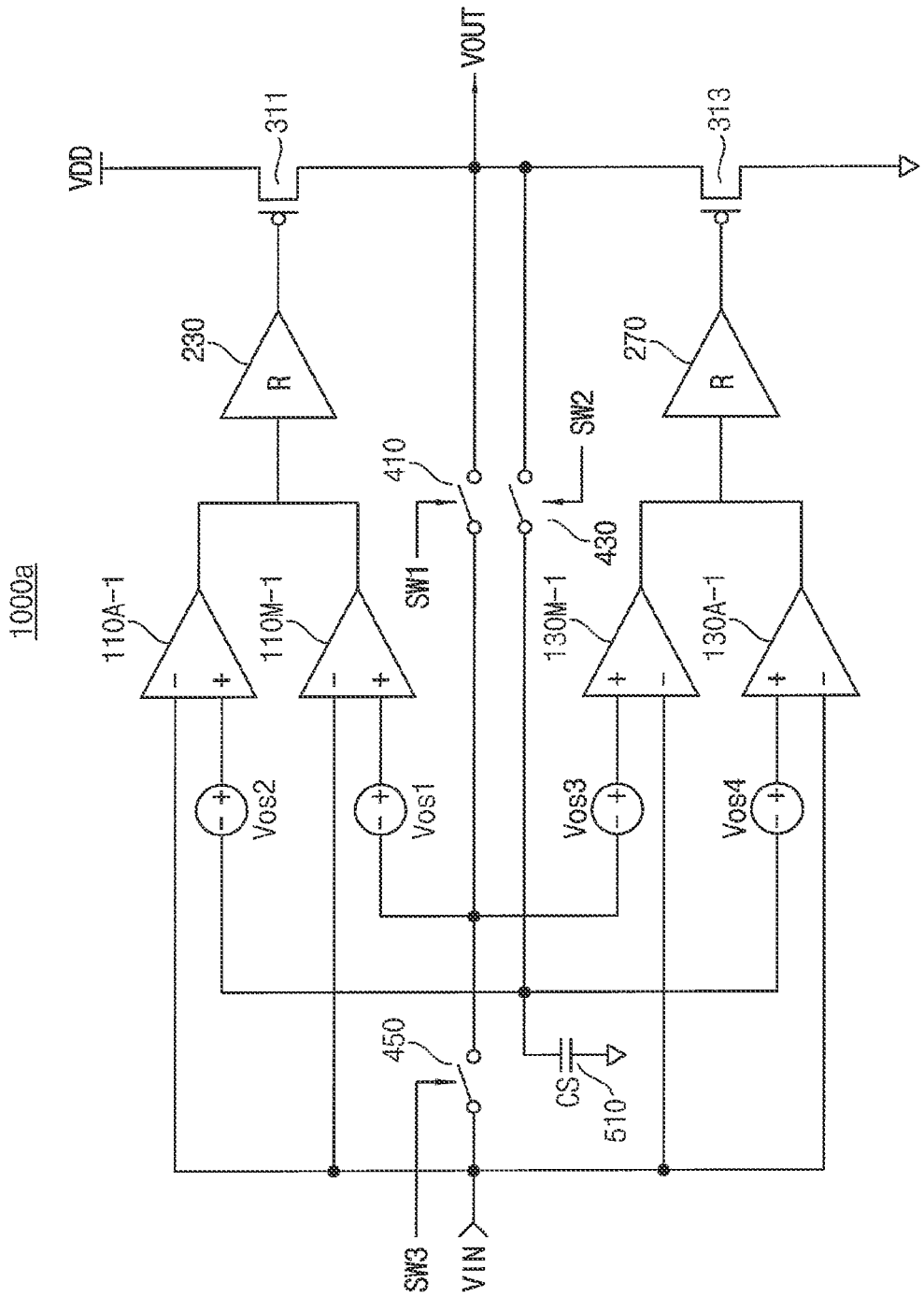
FIG. 3 is a circuit diagram further illustrating in one embodiment (1000a) the operational amplifier 1000 of FIG. 1.

FIG. 3 is a circuit diagram further illustrating in one example (1000a) the operational amplifier 1000 of FIG. 1.

Referring to FIGS. 1 and 3, the operational amplifier 1000a may include sub-operational amplifiers 110M-1, 110A-1, 130M-1 and 130A-1, each having corresponding offset voltages Vos1, Vos2, Vos3 and Vos4, sub-amplifiers 230 and 270, transistors 311, and 313, switches 410, 430 and 450 and capacitor 510. In some embodiments, the sub-operational amplifiers 110M-1, 110A-1, 130M-1 and 130A-1 may correspond to the input stage 100. The sub-amplifiers 230 and 270 may correspond to the amplification stage 200. The switches 410, 430 and 450 may correspond to the switching unit 400. The capacitor 510 may correspond to the voltage storage unit 500. The sub-operational amplifier 110M-1 may correspond to the first main input unit 110M. The sub-operational amplifier 110A-1 may correspond to the first auxiliary input unit 110A. The sub-operational amplifier 130M-1 may correspond to the second main input unit 130M. The sub-operational amplifier 130A-1 may correspond to the second auxiliary input unit 130A. The sub-amplifiers 230 and 270 may include the first current mirror 210 and the second current mirror 250.

The sub-operational amplifiers 110M-1, 110A-1, 130M-1 and 130A-1 may be transconductance amplifiers, and the sub-amplifiers 230 and 270 may be transimpedance amplifiers, but the scope of the present invention is not limited thereto.

Figure 4:
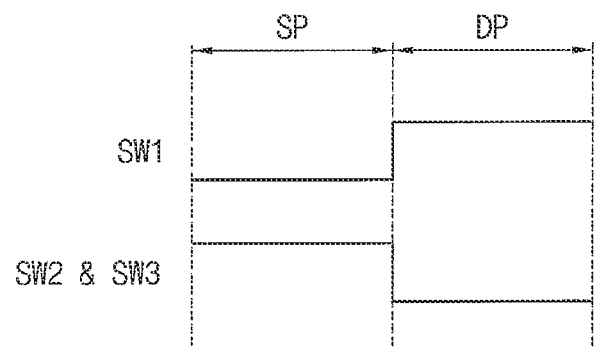
FIG. 4 is a timing diagram illustrating in one example certain control signals for controlling switches in the operational amplifier 1000 of FIG. 1.

FIG. 4 is a timing diagram illustrating certain timing relationships for control signals controlling switches included in the operational amplifier 1000a of FIG. 3.

Referring to FIGS. 3 and 4, each of the switches 410, 430 and 450 may be respectively controlled by control signals SW1, SW2 and SW3.

In some embodiments, the control signal SW1 may represent a first logic level, and the control signals SW2 and SW3 may represent a second logic level during the first operation period SP. The control signal SW1 may represent a second logic level, and the control signal SW2 and SW3 may represent the first logic level during the second operation period DP.

In some embodiments, each of the switches 410, 430 and 450 may control a feedback path from the output stage 300 including transistors 311 and 313 to the input stage 100 including the sub-operational amplifiers 110M-1, 110A-1, 130M-1 and 130A-1 in response to the control signals SW1, SW2 and SW3.

Figure 5A:
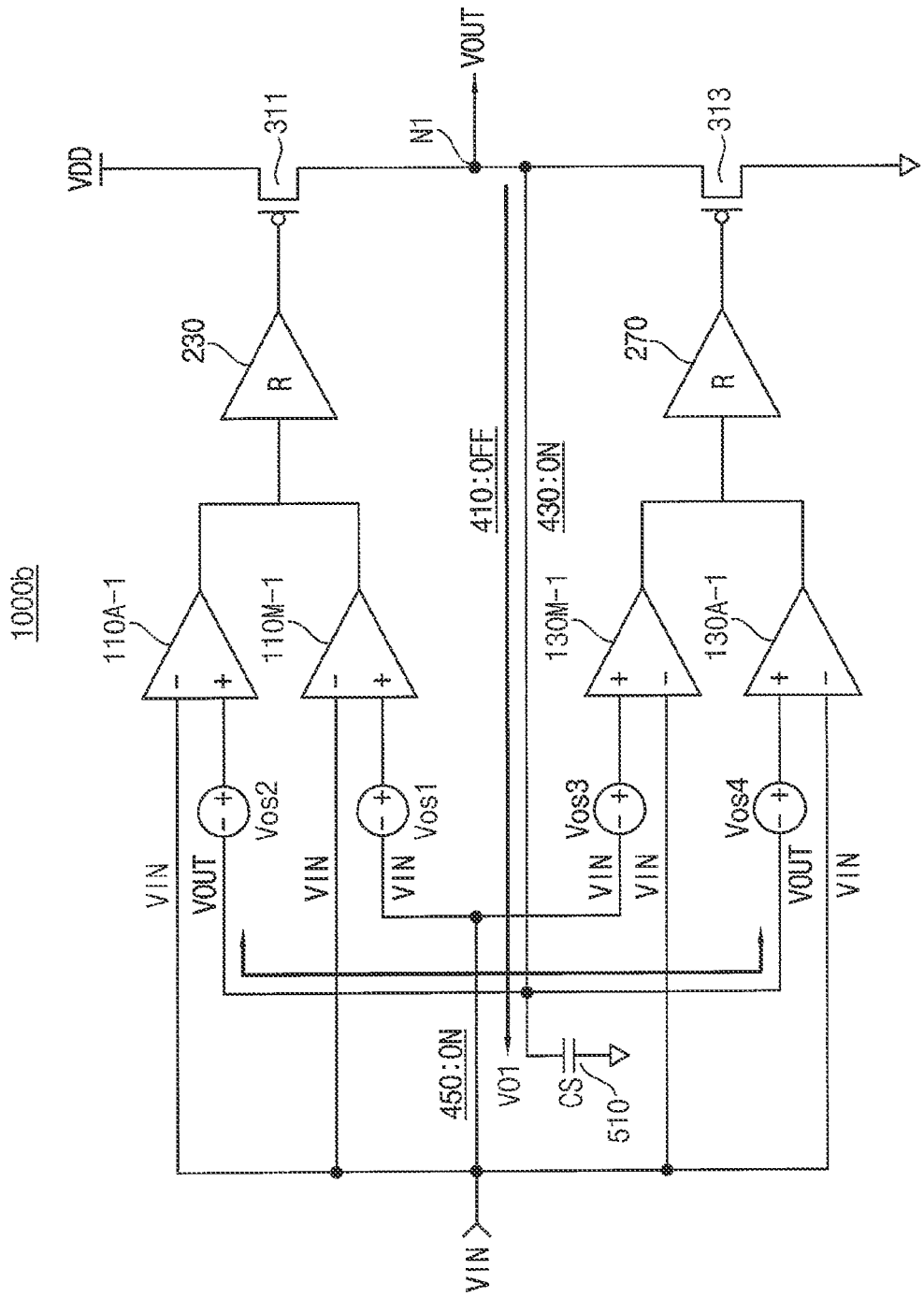
FIGS. 5A and 5B are respective circuit diagrams further describing operation of the operational amplifier 1000a of FIG. 3 during the first operation period and the second operation period.
Figure 5B:
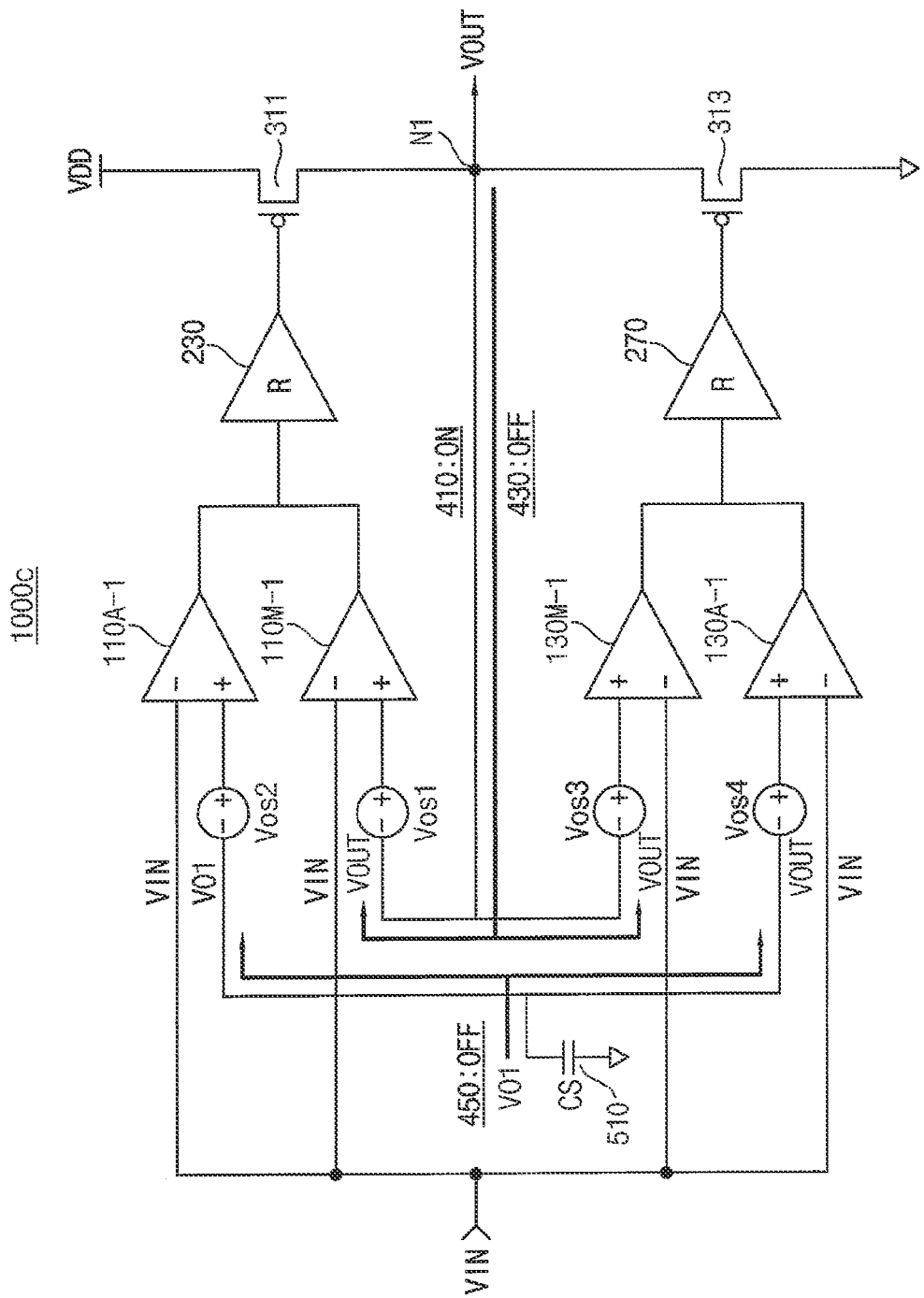

FIGS. 5A and 5B are respective circuit diagrams further illustrating in various examples (1000b and 1000c) the operation of the operational amplifier 1000a of FIG. 3 during the first operation period and the second operation period.

Referring to FIGS. 3, 4 and 5A, during the first operation period, the control signal SW1 may a logic high level (hereafter, "high"), and the control signals SW2 and SW3 may be a logic low level ("hereafter, "low"). Thus, the switch 410 may be turned OFF, and the switches 430 and 450 may be turned ON. In this case, a voltage VIN+Vos1 may be input to a non-inverting terminal of the sub-operational amplifier 110M-1, and a voltage VIN may be input to a inverting terminal of the sub-operational amplifier 110M-1. A voltage VOUT+Vos2 may be input to a non-inverting terminal of the sub-operational amplifier 110A-1, and a voltage VIN may be input to a inverting terminal of the sub-operational amplifier 110A-1. A voltage VIN+Vos3 may be input to a non-inverting terminal of the sub-operational amplifier 130M-1, and a voltage VIN may be input to a inverting terminal of the sub-operational amplifier 130M-1. A voltage VOUT+Vos4 may be input to a non-inverting terminal of the sub-operational amplifier 130A-1, and a voltage VIN may be input to a inverting terminal of the sub-operational amplifier 130A-1.

The sub-operational amplifiers 110M-1, 110A-1, 130M-1 and 130A-1 may generate current corresponding to a difference between voltages input to the non-inverting terminal and the inverting terminal. The currents generated by the sub-operational amplifiers 110M-1 and 110A-1 may be supplied to the sub-amplifier 230, and the currents generated by the sub-operational amplifiers 130M-1 and 130A-1 may be supplied to the sub-amplifier 270.

The sub-amplifiers 240 and 270 may generate voltages corresponding to magnitudes of currents supplied from the sub-operational amplifiers 110M-1, 110A-1, 130M-1 and 130A-1. Voltages generated by the sub-amplifiers 240 and 270 may be supplied to the transistors 311 and 313. That is, operation of the operational amplifier 1000b during the first operation period SP, according to Kirchhoff's current law, may be understood from the following.

Referring to a node N1 shown in FIGS. 5A and 5B, a node equation (Equation 1) may be given as:

$$\{Vos2*gmp+(VOUT+Vos3-VIN)*gmap\}*R*gmop+ \{Vos1*gmn+(VOUT+Vos4-VIN)*gman\}*R*gmon=VOUT/ROUT \quad (1),$$

wherein, each of the Vos1, the Vos2, the Vos3 and the Vos4 is an offset voltage of corresponding sub-operational amplifiers 110M-1, 110A-1, 130M-1 and 130A-1; each of the gmp, the gmap, the gmn and the gman is a transconductance of corresponding sub-operational amplifiers 110M-1, 110A-1, 130M-1 and 130A-1; 'R' is transimpedance of the sub-amplifiers 230 and 270; each of the 'gmop' and the 'gmon' is a transconductance of corresponding transistors 311 and 313; 'ROUT' is an output resistance apparent at node N1; VIN is the input signal; and VOUT is the output signal.

In this case, assuming that the magnitude of 'gmop' and 'gmon' is the same as 'gm', the value of (gmap+gman)*R*gm*ROUT will be sufficiently greater than 1, and magnitudes of gmn, gmp, gmap and gman will be the same. In this regard, the output signal VOUT may be derived using Equation 2 below:

$$VOUT=VIN(\frac{1}{2})*(Vos1+Vos2+Vos3+Vos4)=VIN+\Delta V \quad (2)$$

In Equation 2, $\Delta V$ is equal to $\{(\frac{1}{2})*(Vos1+Vos2+Vos3+Vos4)\}$. Therefore, the output signal VOUT derived by the Equation 2 as a final result of the first operation period may be stored (as a corresponding level of charge) in the capacitor 510.

Referring to FIGS. 3, 4, 5A and 5B, during the second operation period, the control signal SW1 may be low, and the control signal SW2 and SW3 may be high. Accordingly, the switch 410 may be turned ON, and the switched 430 and 450 may be turned OFF. In this case, a voltage VOUT+Vos1 may be input to a non-inverting terminal of the sub-operational amplifier 110M-1, and a voltage VIN may be input to a inverting terminal of the sub-operational amplifier 110M-1. A voltage VO1+Vos2, where VO1 is VIN+$\Delta$V, may be input to a non-inverting terminal of the sub-operational amplifier 110A-1, and a voltage VIN may be input to an inverting terminal of the sub-operational amplifier 110A-1. A voltage VOUT+Vos3 may be input to a non-inverting terminal of the sub-operational amplifier 130M-1, and a voltage VIN may be input to an inverting terminal of the sub-operational amplifier 130M-1. A voltage VOUT+Vos4 may be input to a non-inverting terminal of the sub-operational amplifier 130A-1, and a voltage VIN may be input to an inverting terminal of the sub-operational amplifier 130A-1.

Each of the sub-operational amplifiers 110M-1, 110A-1, 130M-1 and 130A-1 may generate current corresponding to a difference between voltages input to the non-inverting terminal and the inverting terminal. The currents generate by sub-operational amplifiers 110M-1 and 110A-1 may be supplied to the sub-amplifier 230, and the currents generated by the sub-operational amplifiers 130M-1 and 130A-1 may be supplied to the sub-amplifier 270.

The sub-amplifiers 240 and 270 may generate voltages corresponding to magnitudes of currents supplied from the sub-operational amplifiers 110M-1, 110A-1, 130M-1 and 130A-1. Voltages generated by the sub-amplifiers 240 and 270 may be supplied to the transistors 311 and 313. More specifically, operation of the operational amplifier 1000b during the second operation period DP, according to Kirchhoff's current law, may be understood from the following.

Again referring to node N1, another node equation (Equation 3) may be given as:

$$\{(VOUT+Vos2-VIN)*gmp+(VO1+Vos3-VIN)* gmap\}*R*gmop+\{(VOUT+Vos1-VIN)*gmn+ (VO1+Vos4-VIN)*gman\}*R*gmon=VOUT/ ROUT \quad (3)$$

wherein, each of the Vos1, the Vos2, the Vos3 and the Vos4 is an offset voltage of corresponding sub-operational amplifiers 110M-1, 110A-1, 130M-1 and 130A-1; each of the gmp, gmap, gmn and gman is a transconductance of corresponding sub-operational amplifiers 110M-1, 110A-1, 130M-1 and 130A-1; 'R' is transimpedance of the sub-amplifiers 230 and 270; each of the gmop and gmon is transconductance of corresponding transistors 311 and 313; 'ROUT' is an output resistance apparent at node N1; VIN is the input signal, and VOUT is the output signal.

In this case, assuming that the magnitude of magnitude of gmop and gmon is the same as gm, the value of (gmap+gman)*R*gm*ROUT will be sufficiently greater than 1, and magnitudes of gmn, gmp, gmap and gman will be the same as gmx, therefore the output signal VOUT may be derived from Equation 4, as follows:

$$VOUT=VIN+gmx*[0]/(2*gmx)=VIN \quad (4)$$

The output signal VOUT derived by Equation 4 as a final result of the second operation period is the input signal VIN. That is, the operational amplifier 1000b of FIG. 3 may (1) output the output signal VOUT, as 'VIN+$\Delta$V' derived using Equation 2 during the first operation period SP, and (2) output the output signal VOUT, as 'VIN' derived using Equation 4 during the second operation period DP.

Therefore, the operational amplifier 1000b of FIG. 3 may output a signal accurately reflecting the offset voltage associated with the input signal VIN during the first operation period SP, and also output a signal having a magnitude equal to the input signal VIN by compensating for the offset voltage during the second operation period DP.

Figure 6:
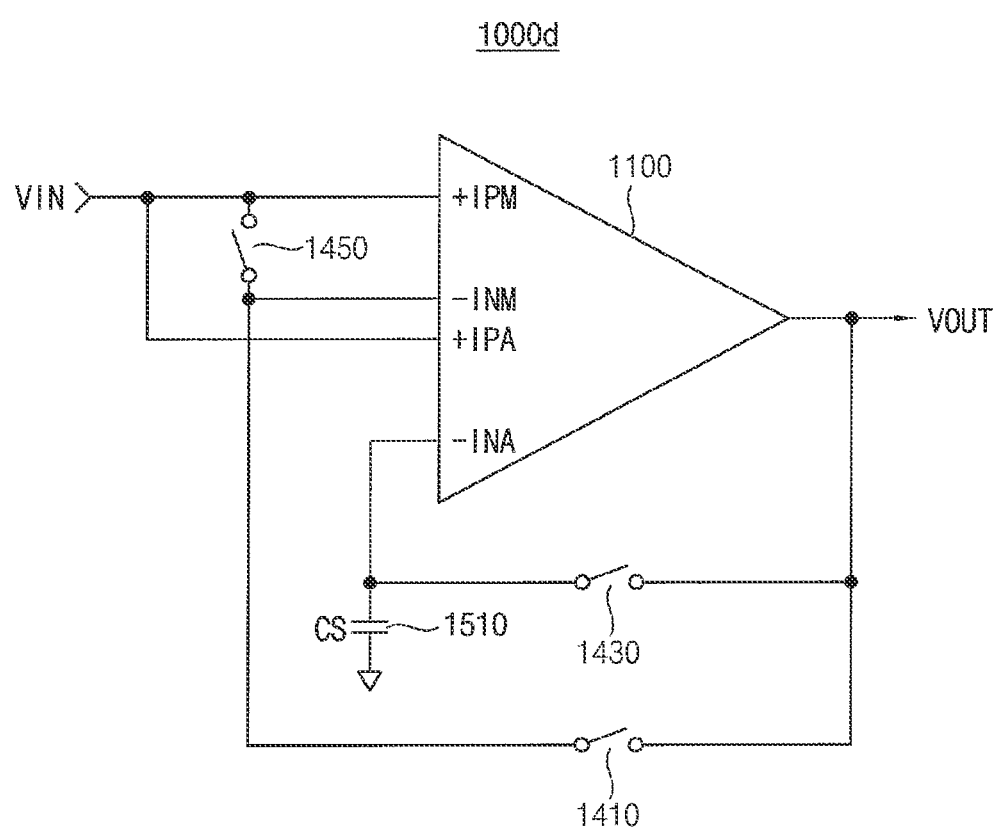
FIG. 6 is a block diagram further illustrating in one example (1000d) the operational amplifier 1000 of FIG. 3.

FIG. 6 is a circuit diagram further illustrating in one example (1000d) the operational amplifier 1000b of FIG. 3.

Referring to FIGS. 3 and 6, the operational amplifier 1000d may include an operational amplifier circuit 1100, switches 1410, 1430 and 1450, and a capacitor 1510. In this case, the operational amplifier 1000d may correspond to the sub-operational amplifiers 110M-1, 110A-1, 130M-1 and 130A-1, the sub-amplifiers 230 and 270 and the transistors 311 and 313. The switches 1410, 1430 and 1450 may correspond to the switches 410, 430 and 450. The capacitor 1510 may correspond to the capacitor 510. An input terminal IPM of the operational amplifier circuit 1100 may correspond to the non-inverting terminal of the sub-operational amplifiers 110M-1 and 130M-1, and an input terminal INM of the operational amplifier circuit 1100 may correspond to the inverting terminal of the sub-operational amplifiers 110M-1 and 130M-1, an input terminal IPA of the operational amplifier circuit 1100 may correspond to the non-inverting terminal of the sub-operational amplifiers 110A-1 and 130A-1, and an input terminal INA of the operational amplifier circuit 1100 may correspond to the inverting terminal of the sub-operational amplifiers 110A-1 and 130A-1.

Hereinafter, the operational amplifier 1000d of FIG. 6 will be used to describe exemplary operation of a source driver and a display device of a display driver IC to certain embodiments of the inventive concept. In this regard, the operation of the operational amplifier 1000d may be substantially the same as the operation of the operational amplifier 1000b.

Figure 7:
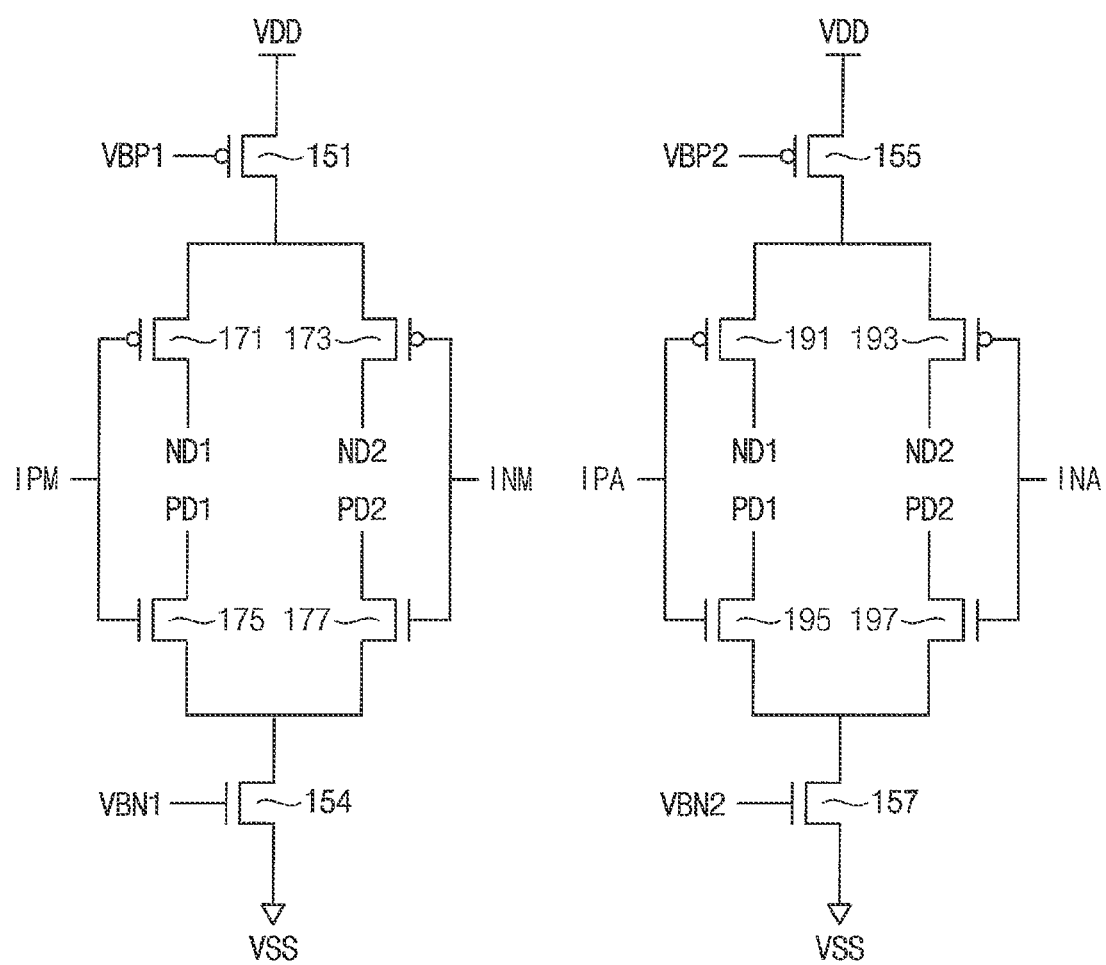
FIG. 7 is a circuit diagram further illustrating in one example the input stage 100 of the operational amplifier 1000 of FIG. 1.

FIG. 7 is a circuit diagram illustrating in one example the input stage 100 of FIG. 1 according to embodiments of the inventive concept.

Referring to FIGS. 1 and 7, the input stage 100 includes PMOS transistors 151, 155, 171, 173, 191 and 193 and NMOS transistors 154, 157, 175, 177, 195 and 197. In some embodiments, bias signals VBP1, VBN1, VBP2 and VBN2 corresponding to gates of the PMOS transistors 151 and 154 and the NMOS transistors 155 and 157 may be applied, and each of the PMOS transistors 151 and 154, and the NMOS transistors 155 and 157 is connected in series between a power supply voltage VDD and ground voltage VSS, and may supply bias currents to the PMOS transistors 171, 173, 191 and 193, and the NMOS transistors 175, 177, 195 and 197.

The gate terminal of each of the PMOS transistor 171 and the NMOS transistor 175 may correspond to the input terminal IPM of FIG. 6, and the gate terminal of each of the PMOS transistor 173 and the NMOS transistor 177 may correspond to the input terminal INM of FIG. 6. The gate terminal of each of the PMOS transistor 191 and the NMOS transistor 195 may correspond to the input terminal IPA of FIG. 6, and the gate terminal of each of the PMOS transistor 193 and the NMOS transistor 197 may correspond to the input terminal INA of FIG. 6. Therefore, the PMOS transistors 171 and 173 may generate currents corresponding to a difference in voltages input to gate terminals of the PMOS transistors 171 and 173, and the NMOS transistors 175 and 177 may generate currents corresponding to a difference in voltages input to gate terminals of the NMOS transistors 175 and 177. The PMOS transistors 191 and 193 may generate currents corresponding to a difference in voltages input to gate terminals of the PMOS transistor 191 and 193, and the NMOS transistors 195 and 197 may generate currents corresponding to a difference in voltages input to gate terminals of the NMOS transistors 195 and 197.

Figure 8:
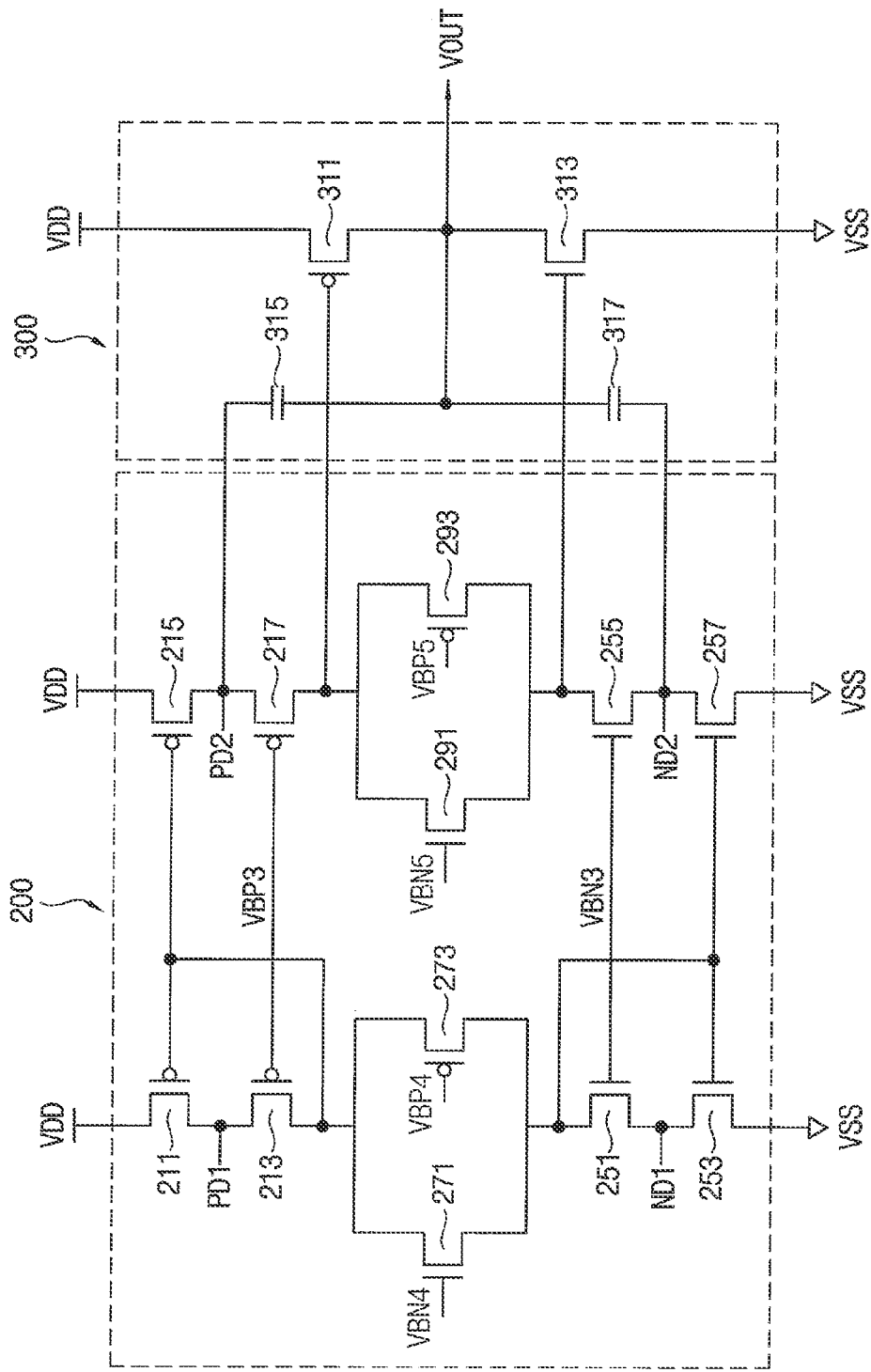
FIG. 8 is a circuit diagram further illustrating in one example the amplification stage 200 and the output stage 300 of the operational amplifier 1000 of FIG. 1.

FIG. 8 is a circuit diagram illustrating in one example the amplification stage 200 and the output stage 300 of FIG. 1 according to embodiments of the inventive concept.

Referring to FIGS. 1, 7 and 8, the amplification stage 200 includes PMOS transistors 211, 213, 215, 217, 217 and 293 and NMOS transistors 251, 253, 255 and 257. In some embodiments, the NMOS transistors 251, 253, 255 and 257 may correspond to the first current mirror of FIG. 1, the PMOS transistors 211, 213, 215 and 217 may correspond to the second current mirror of FIG. 1. Each of the PMOS transistor 273 and the NMOS transistor 291 may operate as a floating current source.

Each of the NMOS transistors 251, 253, 255, 257, 271 and 291, and the PMOS transistors 211, 213, 215, 217, 273 and 293 may be connected in series between the power supply voltage VDD and ground voltage VSS, and may generate voltages corresponding to magnitudes of currents supplied from the input stage 100.

Of note, an exemplary connection relationship between the input stage 100 and the amplification stage 200 has already been described with reference to FIGS. 1 and 2.

The output stage 300 may include a PMOS transistor 311 and an NMOS transistor 313, and capacitors 315 and 317. The PMOS transistor 311 and the NMOS transistor 313 may generate currents corresponding to magnitudes of voltages supplied from the amplification stage 200 as an output signal VOUT. The capacitors 315 and 317 may perform a function of stabilizing a frequency characteristic of the output signal VOUT.

Figure 9:
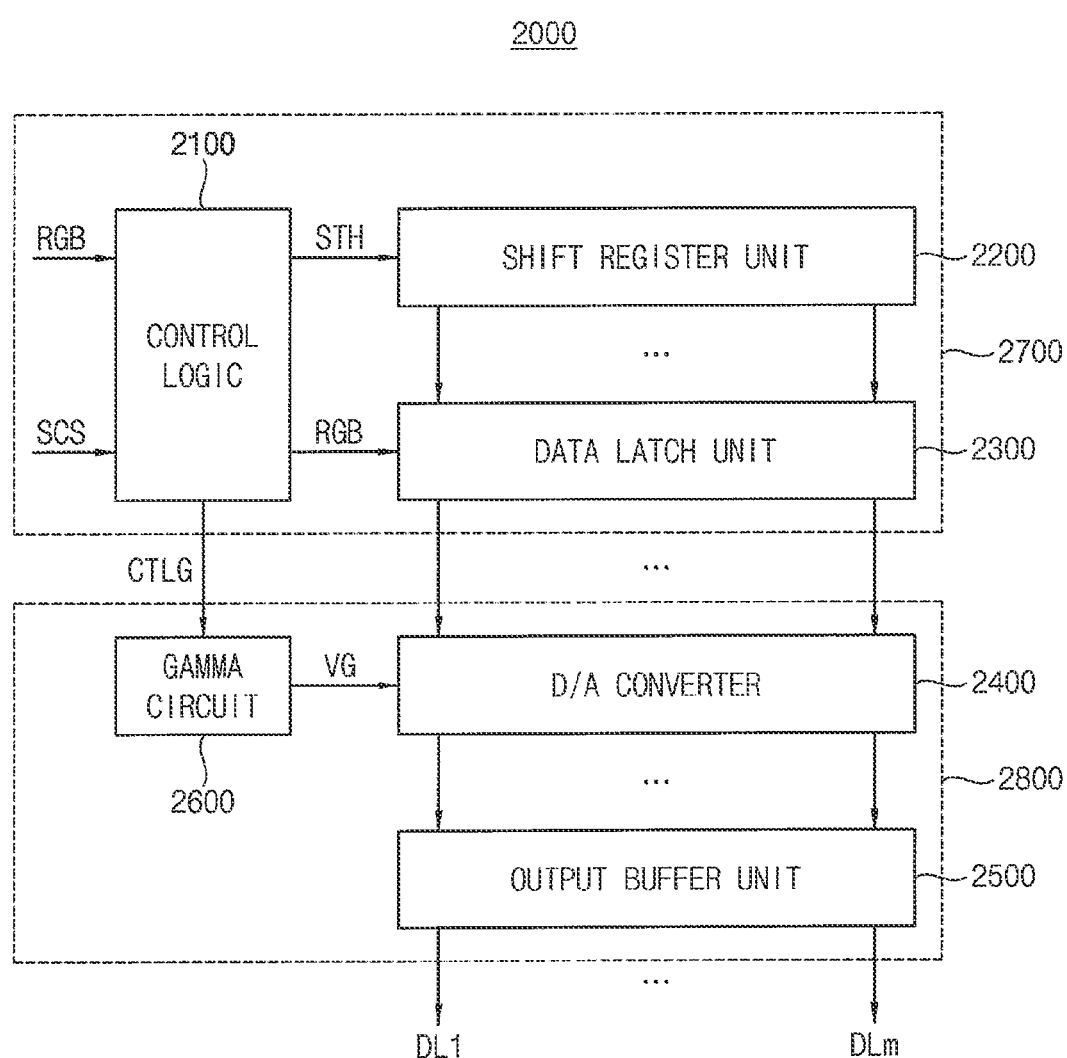
FIG. 9 is a block diagram illustrating a source driver including the operational amplifier 1000 of FIG. 1 according to embodiments of the inventive concept.

FIG. 9 is a block diagram illustrating a source driver 2000 including an operational amplifier according to embodiments of the inventive concept, like the operational amplifier 1000 of FIG. 1 or the operational amplifier 1000a of FIG. 3.

Referring to FIG. 9, the source driver 2000 includes a digital circuit 2700 and an analog circuit 2800. The digital circuit 2700 receives and processes pixel data RGB which is a digital signal. The analog circuit 2800 converts the pixel data RGB into a gray voltage in a form of an analog signal and outputs the analog signal to data lines DL1 to DLm of a display panel.

The digital circuit 2700 includes a shift resister unit 2200, a data latch unit 2300 and a control logic 2100. The shift register unit 2200 controls timing at which the pixel data RGB is sequentially stored in the data latch unit 2300. The shift register unit 2200 sequentially shifts a vertical synchronization start signal STH and transfers the shifted clock signals to the data latch unit 2300. The data latch unit 2300 includes a plurality of latch circuits, and sequentially stores the pixel data RGB corresponding to one horizontal line from one end to the other end of the plurality of latch circuits in response to the clock signal output from the shift register unit 2200. When the storage of the pixel data RGB is completed, the data latch unit 2300 outputs the pixel data RGB in response to a load signal. The control logic 2100 may receive the pixel data RGB and a control signal SCS for controlling the source driver 2000, and generate internal control signals STH and CTLG based on the control signal SCS. The control signal SCS may include a clock signal, a polarity control signal or information signals about driving timing. The control signal SCS may be received in a form of a data packet together with the pixel data RGB. The control logic 2100 may parallelize the received pixel data RGB and transmit the parallelized pixel data RGB to the data latch unit 2300.

The digital circuit 2700 may not include a separate control logic 2100. In this case, the control signals STH and CTLG may be directly provided from outside. When the source driver 2000 and the timing controller providing pixel data RGB and a control signal SCS is integrated in one semiconductor chip, the control signals STH and CTLG may be provided from the timing controller.

The analog circuit 2800 includes a gamma circuit 2600, a digital-to-analog conversion unit 2400 and an output buffer unit 2500. The gamma circuit 2600 generates gray level voltages VG corresponding to each gray level represented by the pixel data RGB. For example, when the pixel data RGB is an N-bit data signal, the gamma circuit 2600 may generate 2N gray voltages VG The digital-to-analog conversion unit 2400 receives the pixel data RGB output from the data latch unit 2300 and outputs an analog gray voltage corresponding to the pixel data RGB among the gray voltages VG For example, a gamma decoder, which is an example of the digital-to-analog conversion unit 2400, decodes N-bit pixel data RGB, selects one gray voltage among 2N gray voltages in response to the decoding results, and outputs the selected gray voltage. The output buffer unit 2500 buffers and outputs the analog gray voltage output from the digital-to-analog conversion unit 2400.

Figure 10:
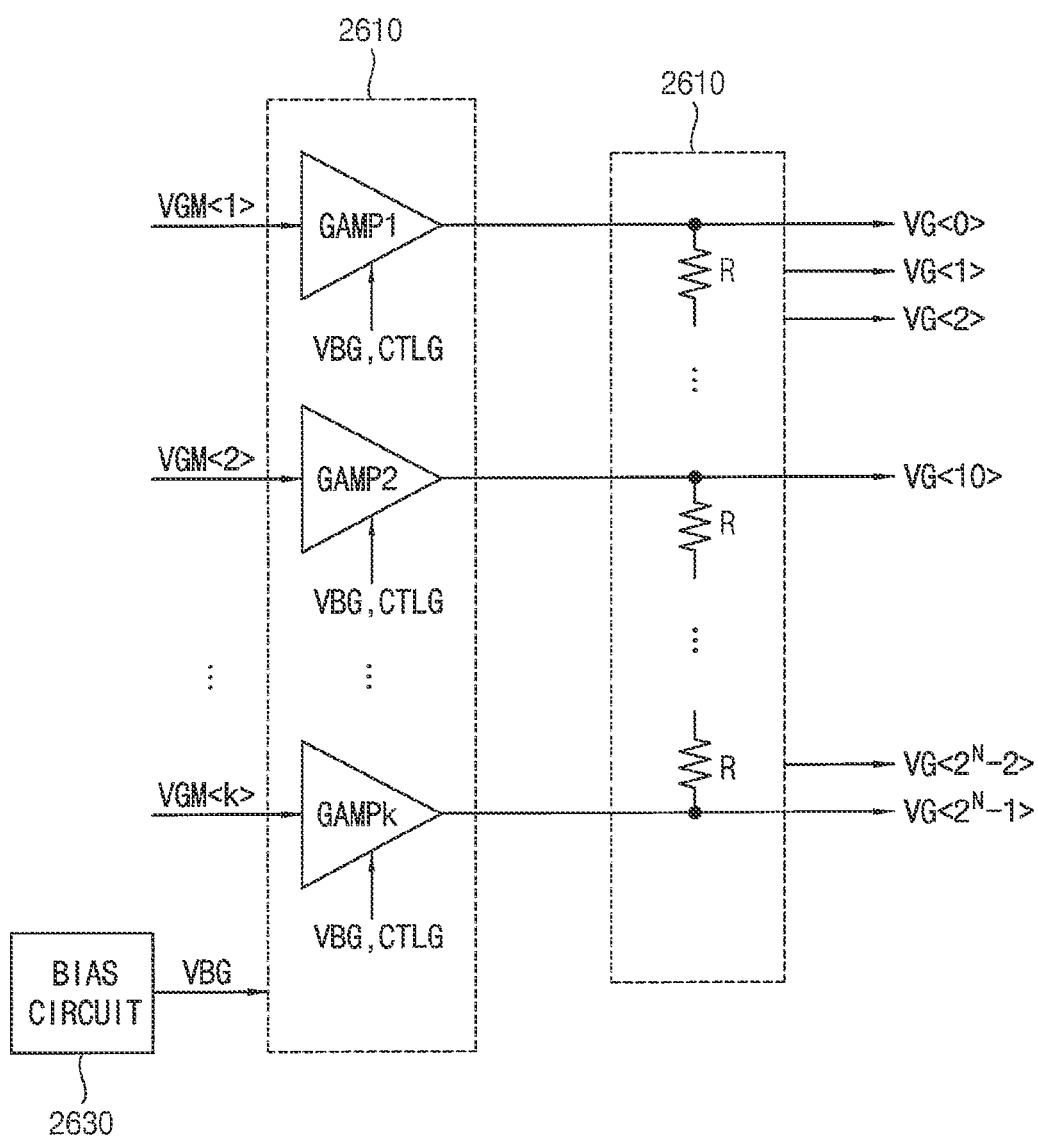
FIG. 10 is a block diagram further illustrating in one example the gamma circuit 2600 of FIG. 9.

FIG. 10 is a block diagram illustrating in one example the gamma circuit 2600 of FIG. 9. Referring to FIG. 10, the gamma circuit 2600 may include a plurality of gamma amplifiers GAMP[1:k] 2610, a bias circuit 260 and a voltage divider 2650.

Each of the gamma amplifiers 2610 may receive, buffer and output a corresponding gamma reference voltage (e.g., VGM<1> to VGM<m>). Here, the gamma reference voltages VGM<1> to VGM<m> may be externally generated or may be generated internally to the source driver 2000. The bias circuit 2630 may be used to generate a bias signal VBG for controlling biases of the gamma amplifiers 2610, and supply the bias signal VBG to the gamma amplifiers 2610. The voltage divider 2650 may be implemented as a resistance string in which a plurality of resistors R are connected in series, and may generate a plurality of gray voltages VG<0> to VG<2N-1> based on the gamma reference voltages VGM<1> to VGM<m>. For example, each of the gamma amplifiers 2610 may be implemented using the operational amplifier 1000d of FIG. 6.

Figure 11:
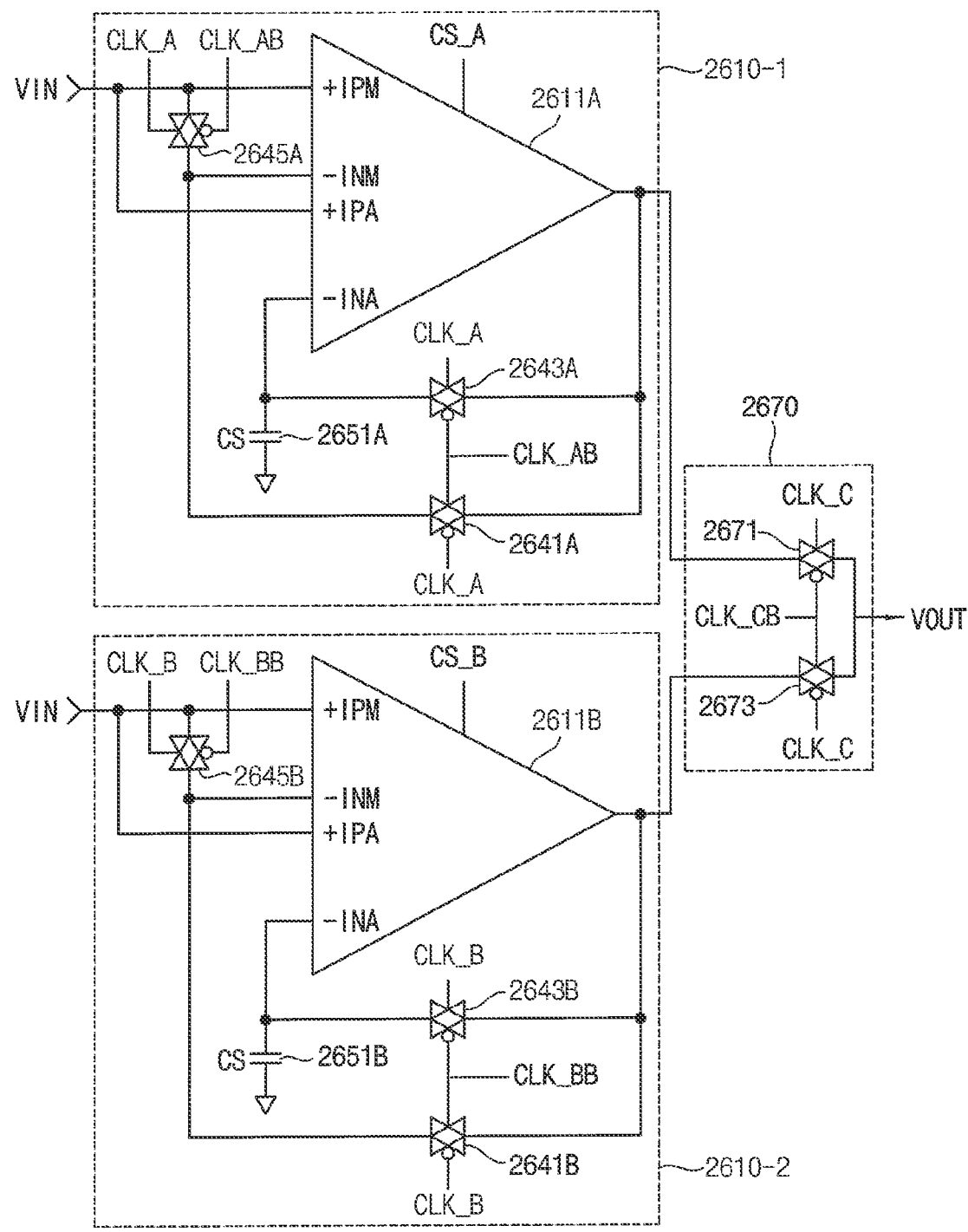
FIG. 11 is a block diagram further illustrating the plurality of gamma amplifiers of FIG. 10.

FIG. 11 is a block diagram further illustrating in one example (2610a) a gamma amplifier that may be used among the plurality of gamma amplifiers 2610 of FIG. 10.

Referring to FIG. 11, the gamma amplifier 2610a may include a first operational amplifier circuit 2610-1, a second operational amplifier circuit 2610-2 and a circuit selector 2670.

The first operational amplifier circuit 2610-1 includes an operational amplifier circuit 2611A, switches 2641A, 2643A and 2645A and a capacitor 2651A, and the second operational amplifier circuit 2610-2 includes an operational amplifier circuit 2611B, switches 2641B, 2643B and 2645B and a capacitor 2651B. The circuit selector 2670 includes switches 2671 and 2673.

Each of the first operational amplifier circuit 2610-1 and the second operational amplifier circuit 2610-2 may be the operational amplifier circuit 1000a described above with reference to FIG. 6. That is, each of the operational amplifier circuit 2611A and the operational amplifier circuit 2611B may correspond to the operational amplifier circuit 1100, switches 2641A, 2643A, 2645A, 2641B, 2643B and 2645B may correspond to the switches 1410, 1430 and 1450, and each of the capacitors 2651A and 2651B may correspond to the capacitor 1510. In some embodiments, the switches 2641A, 2643A, 2645A, 2641B, 2643B and 2645B included in the first operational amplifier circuit 2610-1, the second operational amplifier circuit 2610-2 and the circuit selector 2670 may be implemented as a transmission gate. Each of the switches 2641A, 2643A, 2645A, 2641B, 2643B and 2645B may be controlled in response to corresponding control signals CLK_A, CLK_AB, CLK_B, CLK_BB, CLK_C and CLK_CB.

Each of the first operational amplifier circuit 2611A and the second operational amplifier circuit 2611B may be disabled in response to a selection signals CS_A and CS_B corresponding to each of the first operational amplifier circuit 2611A and the second operational amplifier circuit 2611B.

The circuit selector 2670 selects one of signals output from each of the first operational amplifier circuit 2610-1 and the second operational amplifier circuit 2610-2 and outputs as the output signal VOUT.

Figure 12:
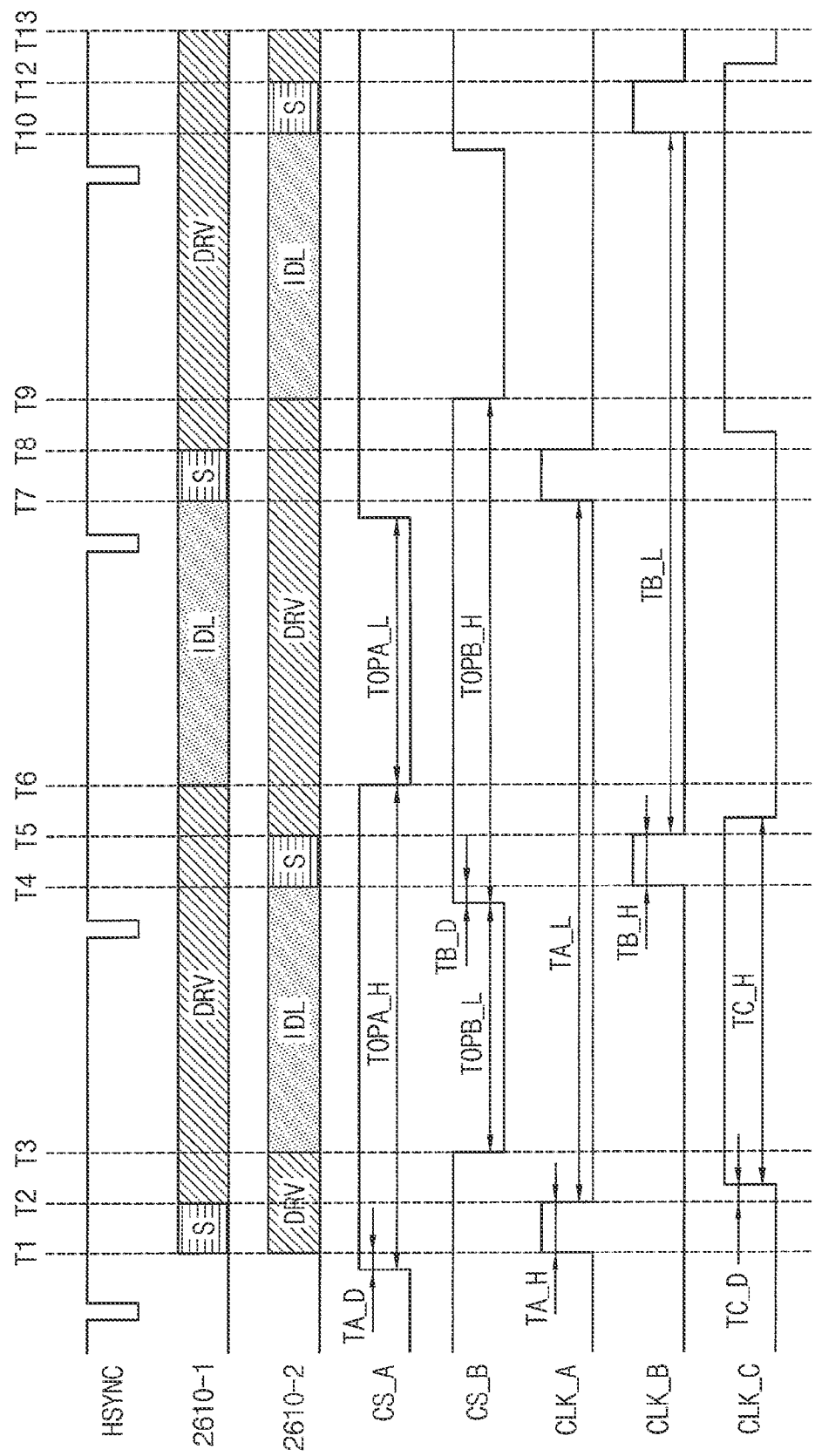
FIG. 12 is a timing diagram further illustrating certain signal relationships during the operation of the gamma amplifier of FIG. 11.

FIG. 12 is a timing diagram illustrating further illustrating signal timing relationships for various signals indicated in the gamma amplifier 2610a of FIG. 11.

Referring to FIG. 12, a horizontal synchronization signal HSYNC, an operation mode of each of a first operational amplifier circuit 2610-1 and a second operational amplifier circuit 2610-2, selection signals CS_A and CS_B and a plurality of clocks CLK_A, CLK_B and CLK_C are illustrated.

The selection signals CS_A and CS_B, and the plurality of clocks CLK_A, CLK_B and CLK_C may be signals included in the control signal CTLG of FIG. 10. In some embodiments, a duration time of logic level intervals, e.g., TA_D, TOPA_H, TOPA_L, TB_D, TOPB_H, TOPB_L, TA_H, TA_L, TB_H, TB_L, TC_D, TC_H and TC_L, of the selection signals CS_A and CS_B, and the plurality of clocks CLK_A, CLK_B and CLK_C may be freely controlled in response to the control signal CTLG.

Here, each of the first operational amplifier 2610-1 and the second operational amplifier 2610-2 may operate in one of a sampling mode, a driving mode and an idle mode.

In some embodiments, when the selection signal CS_A for selecting the operational amplifier circuit 2611A is a logic high level, the first operational amplifier 2610-1 may operate in either the sampling mode or the driving mode, and when the selection signal CS_A is a logic low level, the first operational amplifier 2610-1 may operate in the idle mode. When the clock CLK_A is a logic high level, the first operational amplifier 2610-1 may operate in the sampling mode, and when the clock CLK_A is a logic low level, the first operational amplifier 2610-1 may operate in the driving mode.

In some embodiments, when the selection signal CS_B for selecting the operational amplifier circuit 2611B is a logic high level, the second operational amplifier 2610-2 may operate in either the sampling mode or the driving mode, and when the selection signal CS_B is a logic low level, the second operational amplifier 2610-2 may operate in the idle mode. When the clock CLK_B is a logic high level, the second operational amplifier 2610-2 may operate in the sampling mode, and when the clock CLK_B is a logic low level, the second operational amplifier 2610-2 may operate in the driving mode.

The sampling mode may correspond to the first operation period described above with reference to FIG. 1, and the driving mode may correspond to the second operation period described above with reference to FIG. 1. That is, in the sampling mode, the first operational amplifier 2610-1 and the second operational amplifier 2610-2 may output a signal reflecting the offset voltage in the input signal VIN, and in the driving mode, the first operational amplifier 2610-1 and the second operational amplifier 2610-2 may output a signal having a magnitude equal to the input signal VIN.

In some embodiments, at least one of the first operational amplifier 2610-1 and the second operational amplifier 2610-2 may be controlled to operate in the driving mode. When at least one of the first operation amplifier 2610-1 and the second operational amplifier 2610-2 operates in the driving mode, the other may operates in the idle mode. In this case, the circuit selector 2670 may output continuously a signal having a magnitude equal to the input signal VIN by compensating for the offset voltage. Therefore, when the gamma amplifier 2610*a* of FIG. 11 is used in the gamma circuit 2600 of FIG. 9, the gamma circuit 2600 may continuously output a plurality of gamma voltages compensated for the offset voltage. In addition, when at least one of the first operational amplifier 2610-1 and the second operational amplifier 2610-2 operates in the idle mode, power consumption of the operational amplifier operating in the idle mode may be reduced.

In some embodiments, the first operational amplifier 2610-1 may operate in the sampling mode from a time point T1 to a time point T2 or from a time point T7 to a time point T8, may operate in the driving mode from a time point T2 to a time point T6 or from a time point T8 to a time point T12, and may operate in the idle mode from a time point T6 to a time point T7. The second operational amplifier 2610-2 may operate in the sampling mode from a time point T4 to a time point T5 or from a time point T10 to a time point T11, may operate in the driving mode from a time point T1 to a time point T3 or from a time point T5 to a time point T9, and may operate in the idle mode from a time point T3 to a time point T4 or from a time point T9 to a time point T10.

Figure 13:
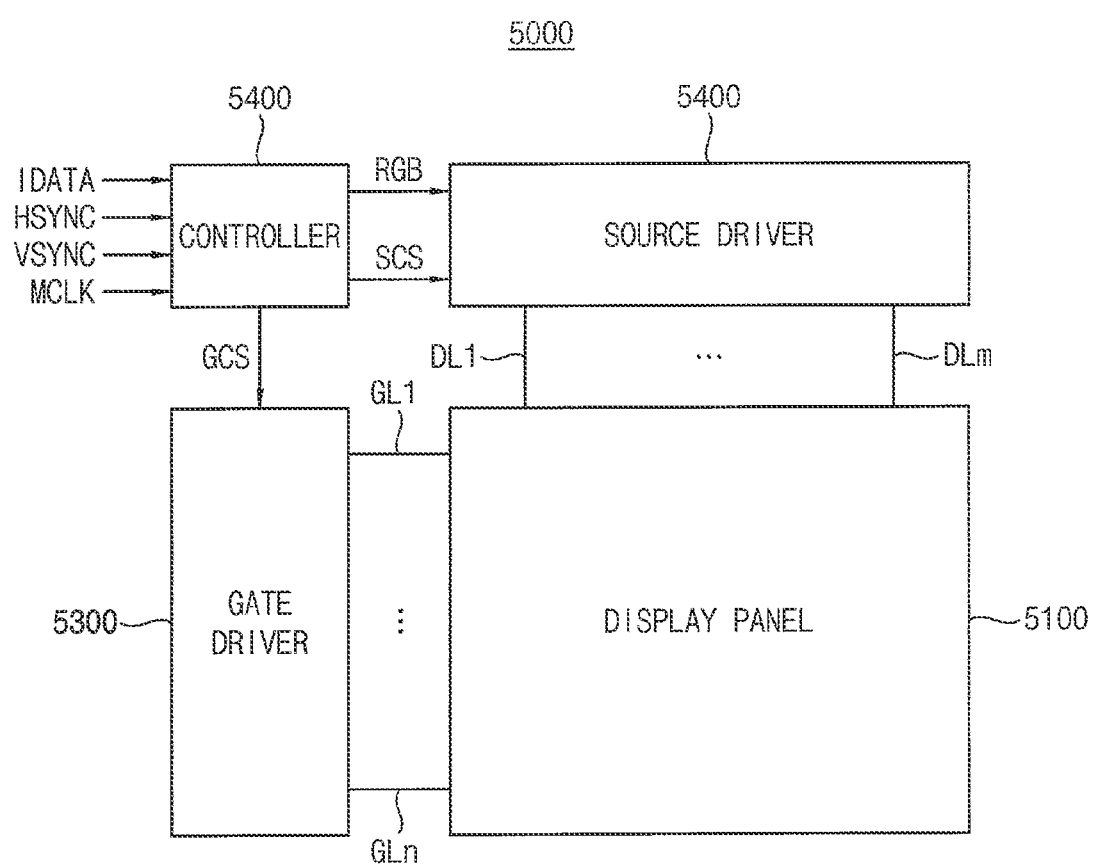
FIG. 13 is a block diagram illustrating a display device including the operational amplifier 1000 of FIG. 1 according to embodiments of the inventive concept.

FIG. 13 is a block diagram illustrating a display device 5000 including an operational amplifier according to embodiments of the inventive concept, like the operational amplifier 1000 of FIG. 1 or the operational amplifier 1000*a* of FIG. 3.

Referring to FIG. 13, the display device 5000 may include a display panel 5100, a source driver 5200, a gate driver 5300 and a controller 5400.

The display panel 5100 includes red, green and blue pixels connected to a plurality of gate lines GL1 to GLn and a plurality of data lines DL1 to DLm, where n and m represent positive integers. In some embodiments, the display panel 5100 may be formed in a pentile structure. For example, the display panel 5100 includes odd rows and even rows. In the odd rows, red pixels R, green pixels G1 and G2, and blue pixels B may be arranged in the order of the red pixel R, the first green pixel G1, the blue pixel B, the second green pixel G2. In the even rows, red pixels R, green pixels G1 and G2, and blue pixels B may be arranged in the order of the blue pixel B, the second green pixel G2, the red pixel R and the first green pixel G1. The display panel 5100 may include m columns respectively connected to the plurality of data lines DL1 to DLm. Further, red pixels R and blue pixels B may be alternately connected to odd-numbered data lines, and first green pixels G1 and second green pixels G2 may be alternately connected to even-numbered data lines.

The controller 5400 receives input data IDATA, a horizontal synchronization signal HSYNC, a vertical synchronization signal VSYNC and a main clock signal MCLK. The controller 5400 divides the input data IDATA in units of frames based on the vertical synchronization signal VSYNC, divides the input data IDATA in units of gate lines based on the horizontal synchronization signal HSYNC and generates image data RGB.

In some embodiments, the image data RGB may include red image data R_D corresponding to red pixels R, first green image data G1_D corresponding to first green pixels G1, second green image data G2_D corresponding to second green pixels G2 and blue image data B_D corresponding to blue pixels B. The controller 5400 provides a gate control signal GCS to the gate driver 5300 and provides a source control signal SCS and image RGB to the source driver 5200. The gate driver 5300 is connected to the display panel 5100 through a plurality of gate lines GL1 to GLn. The gate driver 5300 sequentially selects the plurality of gate lines GL1 to GLn based on the gate control signal GCS. The source driver 5200 is connected to the display panel 5100 through a plurality of data lines DL1 to DLm. The source driver 5200 generates a plurality of driving voltages by processing image data RGB based on a source control signal SCS, and provides the plurality of driving voltages through a plurality of data lines DL1 to DLm to the display panel 5100.

Here, a red driving voltage corresponding to red, a green driving voltage corresponding to green, and a blue driving voltage corresponding to blue are generated using different ranges of gamma voltages. Therefore, when the data driving circuit included in the source driver 5200 alternately generates driving voltages corresponding to different colors to drive the display panel 100, power consumption of the source driver 5200 may increase.

Figure 14:
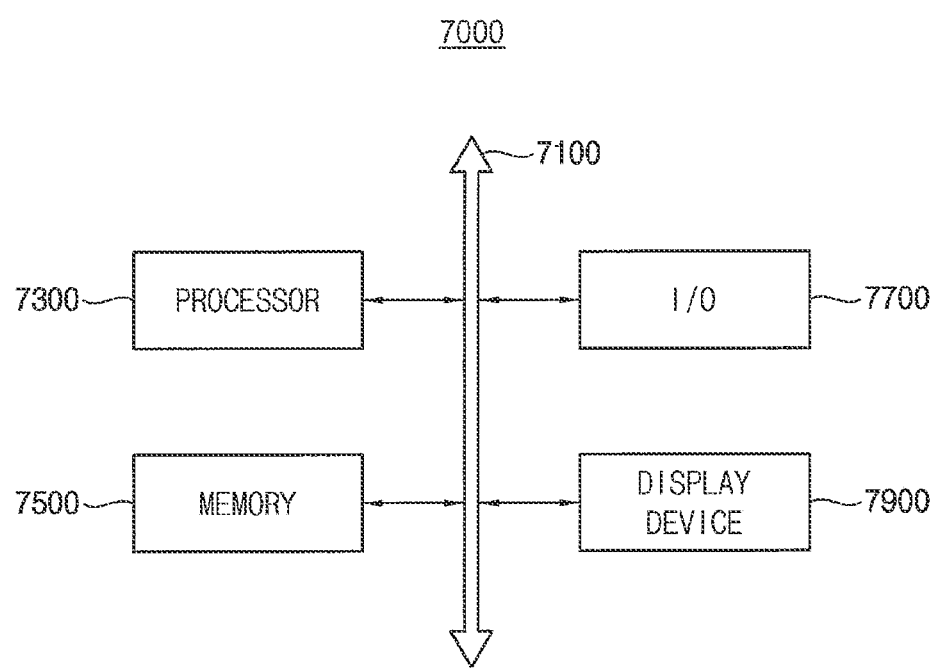
FIG. 14 is a block diagram illustrating an electronic system including the operational amplifier 1000 of FIG. 1 according to embodiments of the inventive concept.

FIG. 14 is a block diagram illustrating an electronic system 7000 including an operational amplifier according to embodiments of the inventive concept, like the operational amplifier 1000 of FIG. 1 or the operational amplifier 1000*a* of FIG. 3.

Referring to FIG. 14, a system 7000 may include a processor 7300, a memory device 7500, an input/output device 7700 and a display device 7900.

The processor 7300 may execute various computing functions, such as executing specific software that performs specific calculations or tasks. For example, the processor 7300 may be a microprocessor or a central processing unit (CPU). The processor 7300 may be connected to the memory device 7500 through the bus 7100. The processor 7300 may be connected to the memory device 7500 and the display device 7900 through an address bus, a control bus, and a data bus to perform communication. In some embodiments, the processor 7300 may also be connected to an expansion bus such as a Peripheral Component Interconnect (PCI) bus.

The memory device 7500 includes volatile memory devices such as a dynamic random access memory (DRAM) and a static random access memory (SRAM), etc., and nonvolatile memory devices such as an Erasable Programmable Read-Only Memory (EPROM), an Electrically Erasable Programmable Read-Only Memory (EEPROM) and a flash memory device. The memory device 7500 may store software executed by the processor 7300.

The input/output device 7700 is connected to the bus 7100 and may include an input means such as keyboard or a mouse and an output means such as a printer. The processor 7300 may control an operation of the input/output device 7700. The display device 7900 is connected to the processor 7300 through a bus 7100.

As described above, the display device 7900 may include a display panel including a plurality of pixels connected to a plurality of gate lines and a plurality of data lines, and a driving unit for driving the display panel. The driving unit may include a timing controller, a source driver, a gate driver, and a power circuit for a display driver.

The system 7000 may be any electronic devices including a mobile phone, a smart phone, a television, a personal digital assistant (PDA), an MP3 player, a notebook computer, a desktop computer and a digital camera that provide an image to a user through the display device 7900.

As described above, the operational amplifier according to some embodiments of the present invention may be implemented as a CMOS circuit. The operational amplifier includes an input stage, an amplification stage and an output stage. Each of a first main input unit and a first auxiliary input unit implemented as a PMOS circuit in the input stage is connected to a first current mirror implemented as an NMOS circuit in the amplification stage.

Each of a second main input unit and a second auxiliary input unit implemented as an NMOS circuit in the input stage is connected to a second current mirror implemented as a PMOS circuit in the amplification stage. In this case, the first current mirror and the second current mirror may be connected in series between a power voltage and ground to occupy a relatively small area.

In addition, when a gamma circuit is implemented using the operational amplifier, the gamma circuit may continuously output a plurality of gamma voltages compensated for offset voltages. Furthermore, when the operational amplifier included in the gamma circuit operates in an idle mode, power consumption of the operational amplifier operating in the idle mode may be reduced.

The foregoing is illustrative in nature and the scope of the inventive concept should not be limited to only the illustrated examples. Although a few embodiments have been described, those skilled in the art will readily appreciate that many modifications are possible in the embodiments without materially departing from scope of the following claims.

What is claimed is:

1. An operational amplifier compensating for an offset voltage, alternately operating in a first operation period and a second operation period, and comprising:
    an input stage including a first main input unit, a first auxiliary input unit, a second main input unit and a second auxiliary input unit;
    an amplification stage including a first current mirror and a second current mirror, the first current mirror receiving currents generated from the first main input unit and the first auxiliary input unit, and the second current mirror receiving currents generated from the second main input unit and the second auxiliary input unit;
    an output stage configured to receive voltages generated by the first current mirror and the second current mirror;
    a voltage storage unit configured to store an intermediate voltage based on an output signal generated by the output stage during at least one of the first operation period and the second operation period; and
    a switching unit configured to differently control a first feedback path between the output stage and the input stage and a second feedback path between the output stage to the voltage storage unit in accordance with the first operation period and the second operation period,
    wherein each of the first main input unit, the first auxiliary input unit, the second main input unit and the second auxiliary input unit corresponds to an sub-operational amplifier,
    wherein, during the first operation period, an input signal is inputted to a non-inverting terminal and an inverting terminal of each of the first main input unit and the second main input unit and an inverting terminal of each of the first auxiliary input unit and the second auxiliary input unit and the output signal is inputted to an non-inverting terminal of each of the first auxiliary input unit and the second auxiliary input unit, and
    wherein, during the second operation period, the input signal is inputted to the inverting terminal of each of the first main input unit, the first auxiliary input unit, the second main input unit and the second auxiliary input unit, the output signal is inputted to the non-inverting terminal of each of the first main input unit and the second main input unit, and the intermediate voltage is inputted to the non-inverting terminal of each of the first auxiliary input unit and the second auxiliary input unit.

2. The operational amplifier of claim 1, wherein the first main input unit and the first auxiliary input unit include first PMOS transistors, and the second main input unit and the second auxiliary input unit include first NMOS transistors, such that first PMOS transistors and first NMOS transistors form a first CMOS circuit, and
    the first current mirror includes second NMOS transistors and the second current mirror includes second PMOS transistors, such that second NMOS transistors and second PMOS transistors form a second CMOS circuit.

3. The operational amplifier of claim 1, wherein the switching unit enables the second feedback path during the first operation period, such that the intermediate voltage is sampled by the voltage storage unit, and
    the switching unit disables the second feedback path during the second operation period.

4. The operational amplifier of claim 1, wherein the switching unit disables the first feedback path during the first operation period, such that the output signal is not applied to the first main input unit and the second main input unit of the input stage, and
    the switching unit enables the first feedback path during the second operation period, such that the output signal is applied to the first main input unit and the second main input unit of the input stage.

5. The operational amplifier of claim 1, wherein the input stage includes a plurality of PMOS transistors and a plurality of NMOS transistors, the plurality of PMOS transistors generate currents corresponding to a difference between voltages input to gate terminals of the plurality of PMOS transistors, and the plurality of NMOS transistors generate currents corresponding to a difference between voltages input to gate terminals of the plurality of NMOS transistors.

6. The operational amplifier of claim 1, wherein the amplification stage includes a plurality of PMOS transistors and a plurality of NMOS transistors, and
    the plurality of PMOS transistors and the plurality of NMOS transistors collectively operate as a first current mirror, a second current mirror and a floating current source.

7. The operational amplifier of claim 6, wherein the first current mirror, the second current mirror and the floating current source are connected in series between a power supply voltage and ground.

8. A gamma circuit generating a gamma voltage and comprising:
    a plurality of gamma amplifiers;
    a bias circuit configured to generate a bias signal and provide the bias signal to the plurality of gamma amplifiers; and
    a voltage divider configured to generate a plurality of grayscale voltages based on gamma reference voltages buffered and output through the plurality of gamma amplifiers, wherein each of the plurality of gamma amplifiers comprises:
a first operational amplifier receiving an input signal and outputting a first signal;
a second operational amplifier receiving the input signal and outputting a second signal; and
a circuit selector configured to select and output one of the first signal and the second signal, wherein the circuit selector continuously outputs a compensated output signal comprising the first signal compensated for an offset voltage of the input signal or the second signal compensated for an offset voltage of the input signal, and
each of the first operational amplifier and the second operational amplifier comprises:
an input stage including a first main input unit, a first auxiliary input unit, a second main input unit and a second auxiliary input unit;
an amplification stage including a first current mirror and a second current mirror, the first current mirror receiving currents generated from the first main input unit and the first auxiliary input unit, and the second current mirror receiving currents generated from the second main input unit and the second auxiliary input unit;
an output stage configured to receive voltages generated by the first current mirror and the second current mirror and to generate the compensated output signal;
a voltage storage unit configured to store an intermediate voltage based on the compensated output signal generated by the output stage during at least one of a first operation period and a second operation period; and
a switching unit configured to differently control a first feedback path between the output stage and the input stage and a second feedback path between the output stage and the voltage storage unit in accordance with the first operation period and the second operation period,
wherein, when the first operational amplifier operates in the first operation period, the second operational amplifier operates in the second operation period, and when the first operational amplifier operates in the second operation period, the second operational amplifier operates in the first operation period.

9. The gamma circuit of claim 8, wherein the first main input unit and the first auxiliary input unit include first PMOS transistors and the second main input unit and the second auxiliary input unit include first NMOS transistors, such that first PMOS transistors and first NMOS transistors form a first CMOS circuit, and
the first current mirror includes second NMOS transistors and the second current mirror includes second PMOS transistors, such that second NMOS transistors and second PMOS transistors form a second CMOS circuit.

10. The gamma circuit of claim 8, wherein the switching unit enables the second feedback path during the first operation period, such that the intermediate voltage is sampled by the voltage storage unit, and
the switching unit disables the second feedback path during the second operation period.

11. The gamma circuit of claim 8, wherein the switching unit disables the first feedback path during the first operation period, such that the compensated output signal is not applied to the first main input unit and the second main input unit of the input stage, and the switching unit enables the first feedback path during the second operation period, such that the compensated output signal is applied to the first main input unit and the second main input unit of the input stage.

12. The gamma circuit of claim 8, wherein the input stage includes a plurality of PMOS transistors and a plurality of NMOS transistors, the plurality of PMOS transistors generate currents corresponding to a difference between voltages input to a gate terminals of each of the plurality of PMOS transistors, and the plurality of NMOS transistors generate currents corresponding to a difference between voltages input to a gate terminals of each of the plurality of NMOS transistors.

13. The gamma circuit of claim 8, wherein the amplification stage includes a plurality of PMOS transistors and a plurality of NMOS transistors, and the plurality of PMOS transistors and the plurality of NMOS transistors operate as a first current mirror, a second current mirror and a floating current source.

14. The gamma circuit of claim 13, wherein the first current mirror, the second current mirror and the floating current source are connected in series between a power supply voltage and ground.

15. A source driver, comprising:
a digital circuit configured to receive and process a digital pixel data; and
an analog circuit configured to convert the digital pixel data into a grayscale voltage in a form of an analog signal and output the grayscale voltage,
wherein the analog circuit includes a gamma circuit that generates a plurality of voltages and comprises:
a first operational amplifier receiving an input signal and outputting a first signal;
a second operational amplifier receiving the input signal and outputting a second signal; and
a circuit selector configured to select and output one of the first signal and the second signal, wherein the circuit selector continuously outputs a compensated output signal comprising the first signal compensated for an offset voltage of the input signal or the second signal compensated for an offset voltage of the input signal, and
wherein each of the first operational amplifier and the second operational amplifier comprises:
an input stage including a first main input unit, a first auxiliary input unit, a second main input unit and a second auxiliary input unit;
an amplification stage including a first current mirror and a second current mirror, the first current mirror receiving currents generated from the first main input unit and the first auxiliary input unit, and the second current mirror receiving currents generated from the second main input unit and the second auxiliary input unit;
an output stage configured to receive voltages generated by the first current mirror and the second current mirror and to generate the compensated output signal;
a voltage storage unit configured to store an intermediate voltage based on the compensated output signal generated by the output stage during at least one of a first operation period and a second operation period; and
a switching unit configured to differently control a first feedback path between the output stage and the input stage and a second feedback path between the output stage and the voltage storage unit in accordance with the first operation period and the second operation period, and wherein, when the first operational amplifier operates in the first operation period, the second operational amplifier operates in the second operation period, and when the first operational amplifier operates in the second operation period, the second operational amplifier operates in the first operation period.

16. The source driver of claim 15, wherein the first main input unit and the first auxiliary input unit include first PMOS transistors and the second main input unit and the second auxiliary input unit include first NMOS transistors, such that first PMOS transistors and first NMOS transistors form a first CMOS circuit, and the first current mirror includes second NMOS transistors and the second current mirror includes second PMOS transistors, such that second NMOS transistors and second PMOS transistors form a second CMOS circuit.

17. The source driver of claim 15, wherein the switching unit enables the second feedback path during the first operation period, such that the intermediate voltage is sampled by the voltage storage unit, and the switching unit disables the second feedback path during the second operation period.

18. The source driver of claim 15, wherein the switching unit disables the first feedback path during the first operation period, such that the compensated output signal is not applied to the first main input unit and the second main input unit of the input stage, and the switching unit enables the first feedback path during the second operation period, such that the compensated output signal is applied to the first main input unit and the second main input unit of the input stage.

19. The source driver of claim 15, wherein the input stage includes a plurality of PMOS transistors and a plurality of NMOS transistors, the plurality of PMOS transistors generate currents corresponding to a difference between voltages input to a gate terminals of each of the plurality of PMOS transistors, and the plurality of NMOS transistors generate currents corresponding to a difference between voltages input to a gate terminals of each of the plurality of NMOS transistors.

20. The source driver of claim 15, wherein the amplification stage includes a plurality of PMOS transistors and a plurality of NMOS transistors, and the plurality of PMOS transistors and the plurality of NMOS transistors operate as a first current mirror, a second current mirror and a floating current source.

\* \* \* \* \*